United States Patent
Kim et al.

(10) Patent No.: US 9,297,672 B2
(45) Date of Patent: Mar. 29, 2016

(54) INTERFACE CIRCUIT FOR DETECTING FAULT OF RESOLVER AND METHOD THEREOF

(71) Applicant: Hyundai Motor Company, Seoul (KR)

(72) Inventors: Bum Sik Kim, Gwangmyeong (KR); Gun Soo Kang, Gyeonggi-do (KR); Kang Ho Jeong, Gyeonggi-do (KR); Hun Kong, Seoul (KR); Jong Kyong Lim, Gyeonggi-do (KR); Young Kook Lee, Seoul (KR); Heon Young Kwak, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 106 days.

(21) Appl. No.: 14/140,157

(22) Filed: Dec. 24, 2013

(65) Prior Publication Data
US 2015/0077156 A1    Mar. 19, 2015

(30) Foreign Application Priority Data
Sep. 16, 2013    (KR) .................. 10-2013-0110965

(51) Int. Cl.
| | |
|---|---|
| *G01D 1/00* | (2006.01) |
| *G01R 31/34* | (2006.01) |
| *G01D 5/244* | (2006.01) |
| *G01R 31/28* | (2006.01) |

(52) U.S. Cl.
CPC .......... *G01D 5/24457* (2013.01); *G01D 5/2448* (2013.01); *G01R 31/2829* (2013.01)

(58) Field of Classification Search
CPC ... G01D 1/00; G01D 5/24457; G01D 5/2448; G01R 31/2829; G01R 31/34
USPC ................ 324/765; 318/490, 605; 702/35, 87
See application file for complete search history.

(56) References Cited

U.S. PATENT DOCUMENTS

| | | | | |
|---|---|---|---|---|
| 9,043,165 | B2 * | 5/2015 | Oowada .......................... | 702/35 |
| 2001/0054911 | A1 | 12/2001 | Kobayashi et al. | |
| 2004/0010386 | A1 * | 1/2004 | Kameya ......................... | 702/87 |
| 2007/0291424 | A1 * | 12/2007 | Nishimoto et al. ............. | 361/23 |

(Continued)

FOREIGN PATENT DOCUMENTS

| | | |
|---|---|---|
| JP | 2004-045286 A | 2/2004 |
| JP | 2005-024493 A | 1/2005 |
| JP | 2008-164560 A | 7/2008 |

(Continued)

*Primary Examiner* — Arleen M Vazquez
*Assistant Examiner* — Akm Zakaria
(74) *Attorney, Agent, or Firm* — Mintz Levin Cohn Ferris Glovsky and Popeo, P.C.; Peter F. Corless (57) ABSTRACT

An interface circuit for detecting a fault in a resolver is provided. More specifically, the interface circuit includes the resolver connected to an intermediate point of a stator coil of a first output terminal for a sine wave signal and an intermediate point of the stator coil of a second output terminal for a cosine wave signal to output the sine and cosine wave signals as a common mode signal. Also includes is resolver fault detection interface unit that adjusts a gain and an offset of the sine wave signal and the cosine wave signal in order to adjust the sine wave signal and the cosine wave signal received as a common mode signal to a frequency that can be suitably applied to an analog/digital terminal of a microcomputer, and to allow high-frequency components of the sine wave signal and the cosine wave signal to pass therethrough.

5 Claims, 4 Drawing Sheets

(56) References Cited

U.S. PATENT DOCUMENTS

2009/0179605 A1* 7/2009 Kanekawa et al. ........... 318/490
2010/0045227 A1* 2/2010 Ura et al. ..................... 318/490

FOREIGN PATENT DOCUMENTS

| KR | 10-2013-0029195 | | 3/2013 |
| KR | 10-2013-0064606 | A | 6/2013 |

* cited by examiner

RELATED ART

FIG. 4

INTERFACE CIRCUIT FOR DETECTING FAULT OF RESOLVER AND METHOD THEREOF

CROSS-REFERENCE TO RELATED APPLICATION

This application claims under 35 U.S.C. §119(a) the benefit of Korean Patent Application No. 10-2013-0110965 filed Sep. 16, 2013, the entire contents of which are incorporated herein by reference.

BACKGROUND (a) Technical Field

The present invention relates to an interface circuit for detecting a fault in a resolver and a method of detecting the fault in the resolver using the same.

(b) Background Art

A hybrid electric vehicle or electric vehicle typically employ a driving motor, such as a permanent-magnet synchronous motor (PMSM), in order to obtain driving force to propel the vehicle in a forward or reverse direction. These motors typically include a one or more permanent magnets that apply a magnetic and reluctance torque to a shaft connected to the driving motor.

In order to achieve high-performance control while applying magnetic torque and reluctance torque to a rotor of the driving motor consistently, information regarding the speed of the driving motor and a position of the rotor is required. Conventionally, an environment-friendly vehicle uses a resolver with excellent environment-resistance and a wide range of usable temperatures in order to detect the position of the driving motor.

Figure 3:
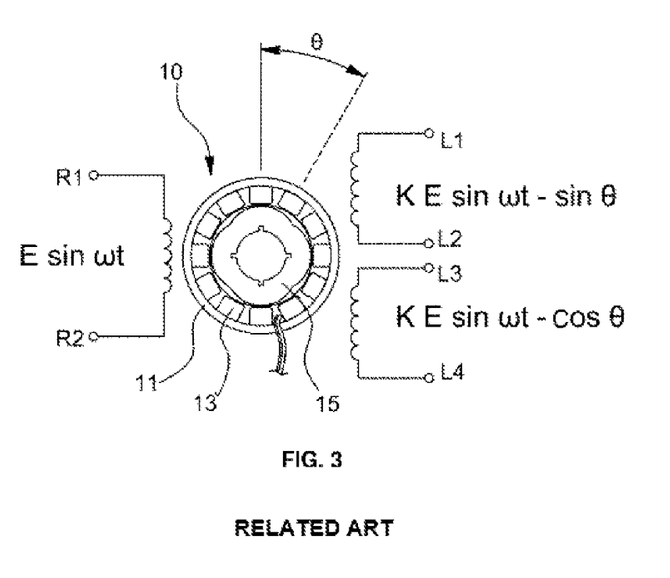
FIG. 3 is a schematic view showing a configuration of a conventional resolver.

FIG. 3 is a schematic view showing a configuration of a conventional resolver. The resolver 13 includes a stator 13 wound with a coil inside a housing 11, a rotor made of permanent magnet and installed inside the stator 13, input terminals R1 and R2 to which AC voltage is supplied, first output terminals L1 and L2 that output a sine wave signal therethrough according to a position of the permanent magnet rotor 13 having north pole to (N-pole) and south pole (S-pole) and a second output terminals L3 and L4 for outputting a cosine wave signal therethrough.

When the rotor 15 is rotated upon supplying an AC voltage to the stator 13 wound with the coil through the input terminals R1 and R2, a magnetic coupling coefficient between the stator 13 and the rotor 15 is varied, so that an amplitude-modulated carrier frequency having a sine wave form is output through the first output terminals L1 and L2 as the sine wave signal and an amplitude-modulated carrier frequency having a sine wave form is output through the second output terminals L3 and L4 as the cosine wave signal.

Thus, a rotation angle θ of the resolver may be determined by using the phase variations of the sine and cosine wave signals output through the first and second output terminals L1, L2, L3 and L4. In addition, an excitation signal is applied to the input terminals R1 and R2 of the resolver 10 through a lead wire, and the first and second output terminals L1, L2, L3 and L4 are connected to an RDC (Resolver to Digital Converter) through the lead wire.

Figure 4:
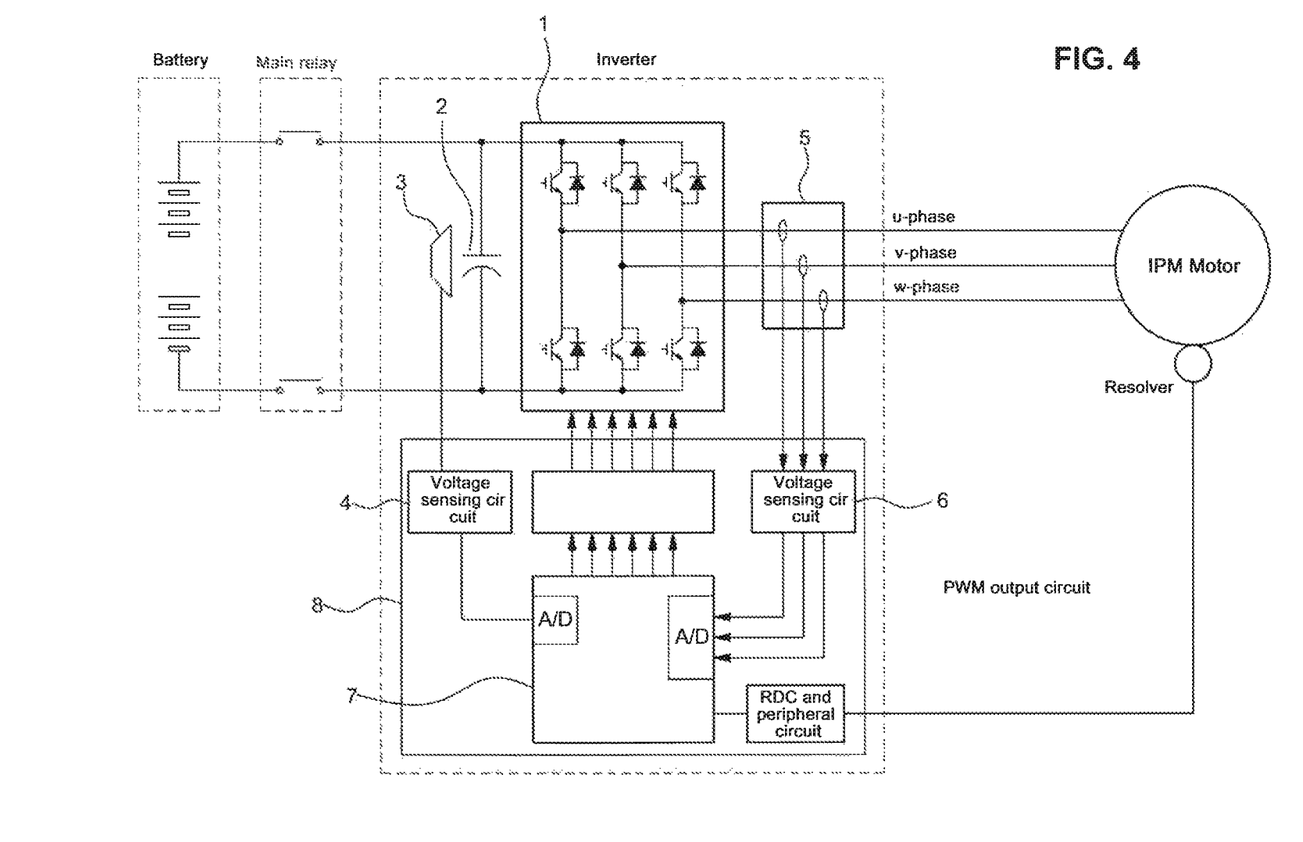
FIG. 4 is a circuit diagram showing an inverter system of a hybrid or electric vehicle to which the resolver is applied.

FIG. 4 is a circuit diagram showing an inverter system of a hybrid or electric vehicle to which the resolver is applied. The inverter system used in the hybrid or electric vehicle in particular includes a power module (IGBT (Insulated Gate Bipolar Mode Transistor)) 1, a DC-link capacitor 2, a DC-link voltage sensor 3, a DC-link voltage sensing circuit 4, a to current sensor 5, a current sensing circuit 6m a computing processing unit (CPU) 7 and a control/gate board 8.

The power module 1 transfers electrical current between a battery and the PMSM and the DC-link capacitor 2 absorbs a ripple effect generated by the DC voltage from the inverter operation so that the ripple effect is prevented from being transferred to the battery. The DC-link voltage sensing circuit 4 processes the output from the DC voltage sensor 3 in order to adjust the output into a range in which the output may be input to an analog/digital converter, and prevents a voltage measurement error from occurring.

Additionally, the current sensor 5 measures an AC current of the invertor which can be used for inverter control. The current sensing circuit 6 processes the output from the current sensor 5 in order to adjust the output into a range in which the output may be input to the analog/digital converter, and prevents a current measurement error from occurring. The CPU 7, in which inverter control software is installed, controls the overall operation of the inverter by using the measured physical quantity. The control/gate board 8 provides spaces in which components used for the inverter-control of the CPU 7 and any other circuits are mounted thereon.

In the inverter system described above, the resolver provides information to the control system regarding the position of the motor rotator, so that the control system of the hybrid or electric vehicles is able to accurately control the motor. However, if the resolver itself fails due to a short circuit, it is impossible to detect the any issues in the motor and as a result the vehicle may be inoperable depending on the circumstances.

SUMMARY OF THE DISCLOSURE

The present invention provides an interface circuit that detects a fault (i.e., failure) in a resolver by transferring an output signal from the resolver as a common mode signal to a CPU.

In order to achieve the above object, the interface circuit for detecting a fault in a resolver according to one aspect of the present invention includes a resolver connected to an intermediate point of a stator coil of a first output terminal for a sine wave signal, and an intermediate point of the stator coil of a second output terminal for a cosine wave signal to output the sine and cosine wave signals as a common mode signal; and a resolver fault detection interface unit (i.e., a detector) configured to adjust a gain and an offset of the sine wave signal and the cosine wave signal in order to adjust the sine wave signal and the cosine wave signal received as a common mode signal to a voltage level (e.g., 0~5 V) that can be suitably applied to an analog/digital terminal of a microcomputer, and to allow high-components of the sine wave signal and the cosine wave signal to pass therethrough.

The resolver fault detection interface unit in some embodiments of the present invention may be made up of a plurality of resolver fault detection interface units. These resolver fault detection interface units are individually connected in parallel to output terminals of the resolver and may be provided in equal number to that of the output terminals of the resolver, respectively.

The resolver fault detection interface unit of the exemplary embodiment of the present invention may include a first resistor having a first terminal connected to an output terminal of the resolver and a second terminal connected to a first terminal of a first capacitor, first terminal of a third resistor, a non-inverting input terminal of a first operational amplifier, an anode of a first diode and a cathode of a second diode; a second resistor having a first terminal connected to a cathode of the first diode, an anode of the second diode, an inverting input terminal of the first operation amplifier, a first terminal of a sixth resistor and one terminal of a second capacitor, Additionally, an output terminal of the first operational amplifier may be connected to a first terminal of a third capacitor, a second terminal of the sixth resistor and a second terminal of the second capacitor. A second terminal of the third capacitor may be connected to a first terminal of a fourth resistor, a non-inverting input terminal of a second operational amplifier, an anode of a third diode, a cathode of a fourth diode and a first terminal of a fifth resistor. Furthermore, a first terminal of a seventh resistor may be connected to a cathode of the third diode, an anode of the fourth diode, a non-inverting input terminal of the second operational amplifier and a first terminal of a eighth resistor. An output terminal of the second operational amplifier may be connected to a first terminal of a ninth resistor and a second terminal of the eighth resistor. A second terminal of the ninth resistor may be connected to a first terminal of a fourth capacitor, an anode of a fifth diode, a cathode of a sixth diode, and a first terminal of a tenth resistor. A second terminal of the tenth resistor may be connected to an analog/digital converting terminal of an operational unit. Furthermore, in the resolver fault detection interface unit a ground may be connected to a second terminal of the second resistor, a negative driving power terminal of the first operational amplifier, a second terminal of the fifth resistor, a second terminal of the seventh resistor, a negative driving power terminal of the second operational amplifier, a second terminal of the fourth resistor, and an anode of the sixth diode.

Also, a first power source may be connected to a second terminal of the first capacitor, a second terminal of the third resistor, a second terminal of the fourth resistor, and a cathode of the fifth diode. A second power source may be connected to a positive driving power terminal of the first operational amplifier and a positive driving power terminal of the second operational amplifier.

In another exemplary embodiment, the present invention provides a method of providing an interface for detecting a fault in a resolver. In particular, the method includes: withdrawing, by an interface circuit, a sine signal and a cosine signal as a common mode signal from an output terminal of the resolver configured to detect a position of a rotor of a motor; adjusting, by the interface circuit, a gain of the sine and cosine signals withdrawn as the common mode signal to be suitably applied to an analog/digital converting terminal of a microcomputer; adjusting, by the interface circuit, an offset of the sine and cosine signals withdrawn as the common mode signal to be suitable to be applied to the analog/digital converting terminal of a microcomputer; and applying, by the interface circuit, a high-frequency signal of the sine and cosine signals withdrawn as the common mode signal to the analog/digital converting terminal of a microcomputer.

The withdrawing of the sine signal and the cosine signal as the common mode signal is performed when an intermediate point of a coil between first and third output terminals of the resolver is connected to an intermediate point of a coil between second and fourth terminals of the resolver.

Accordingly, the circuit for detecting a fault of a resolver according to the present invention has the following advantages:

First, since a fault from, for example, a disconnection of a wire or a short circuit, may be accurately detected, the reliability of the hybrid or electric vehicle may be improved.

Second, since the signal from the resolver is output as the common mode signal, it may be more accurately identify a fault in the resolver, such as a disconnected wire or a short circuit.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, the present invention will be described in detail with reference to the accompanying drawings.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles, fuel cell vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Figure 1:
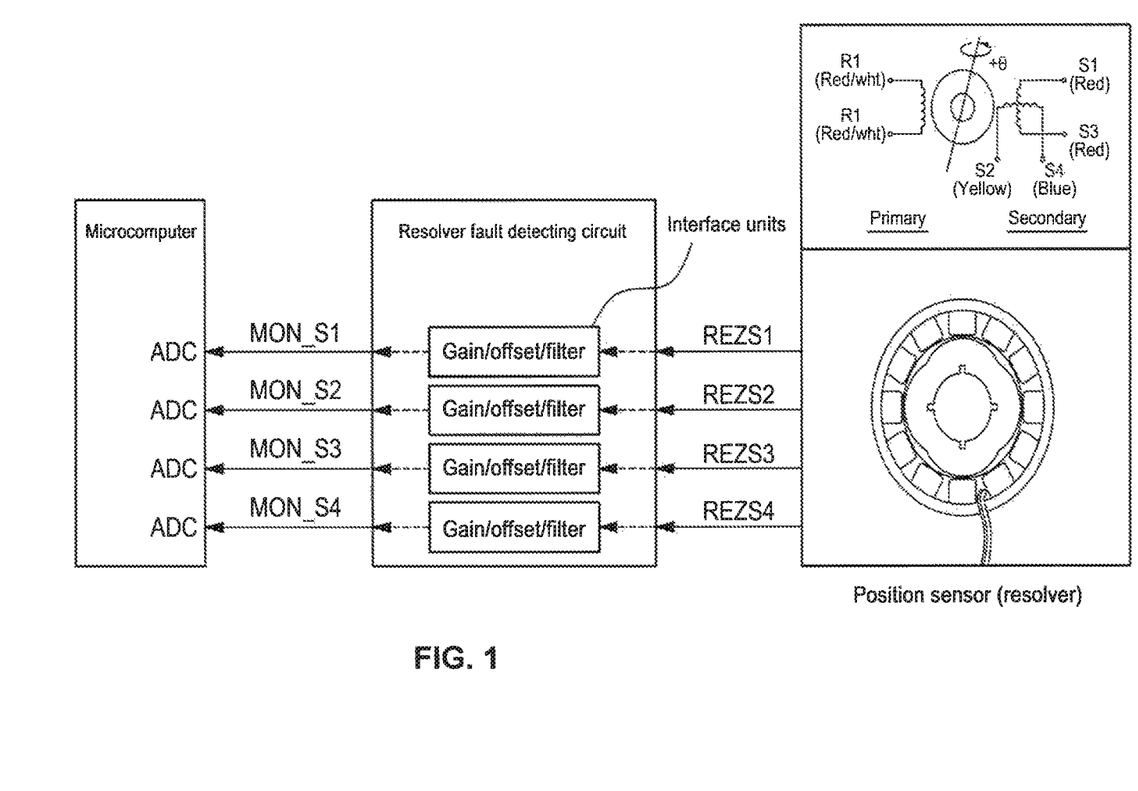
FIG. 1 is a view showing an interface circuit for detecting a fault of a resolver connected to a microcomputer according to an exemplary embodiment of the present invention.

FIG. 1 is a view showing an interface circuit for detecting a fault in a resolver connected to a microcomputer according to an exemplary embodiment of the present invention. The interface circuit for detecting a fault in a resolver according to the exemplary embodiment of the present invention may withdraw a cosine wave signal and a sine wave signal as a common mode signal while withdrawing the cosine wave signal and the sine wave signal from the resolver 500. That is, first output terminals S1 and S3 and second terminals S2 and S4 of the resolver 500 may be connected in common to each other in order to accurately detect when there is a fault in the resolver.

In order to convert the signal withdrawn from the resolver 500 into a signal suitable to be used by the microcomputer 600, the signal may be applied to the microcomputer 600 through the interface circuit for detecting a fault of a resolver according to an embodiment of the present invention. The microcomputer 600 may include a processor and a memory which are configured to interpret the signals received from the interface circuit of the illustrative embodiment of the present invention.

The sine wave signal and the cosine wave signal of the common signal, which are withdrawn from the resolver 500 through the interface circuit for detecting a fault of a resolver 500, may be converted into signals suitable to be analyzed by the microcomputer 600 through a gain and offset process after removing unnecessary components therefrom.

The signal, which is output from the interface circuit for detecting a fault of a resolver, may be input to the microcomputer 600 through an analog/digital terminal of the microcomputer 600. The microcomputer 600 may convert the signal into a digital signal and may identify whether a fault, such as a disconnected wire or a short circuit has occurred in the resolver 500.

Figure 2:
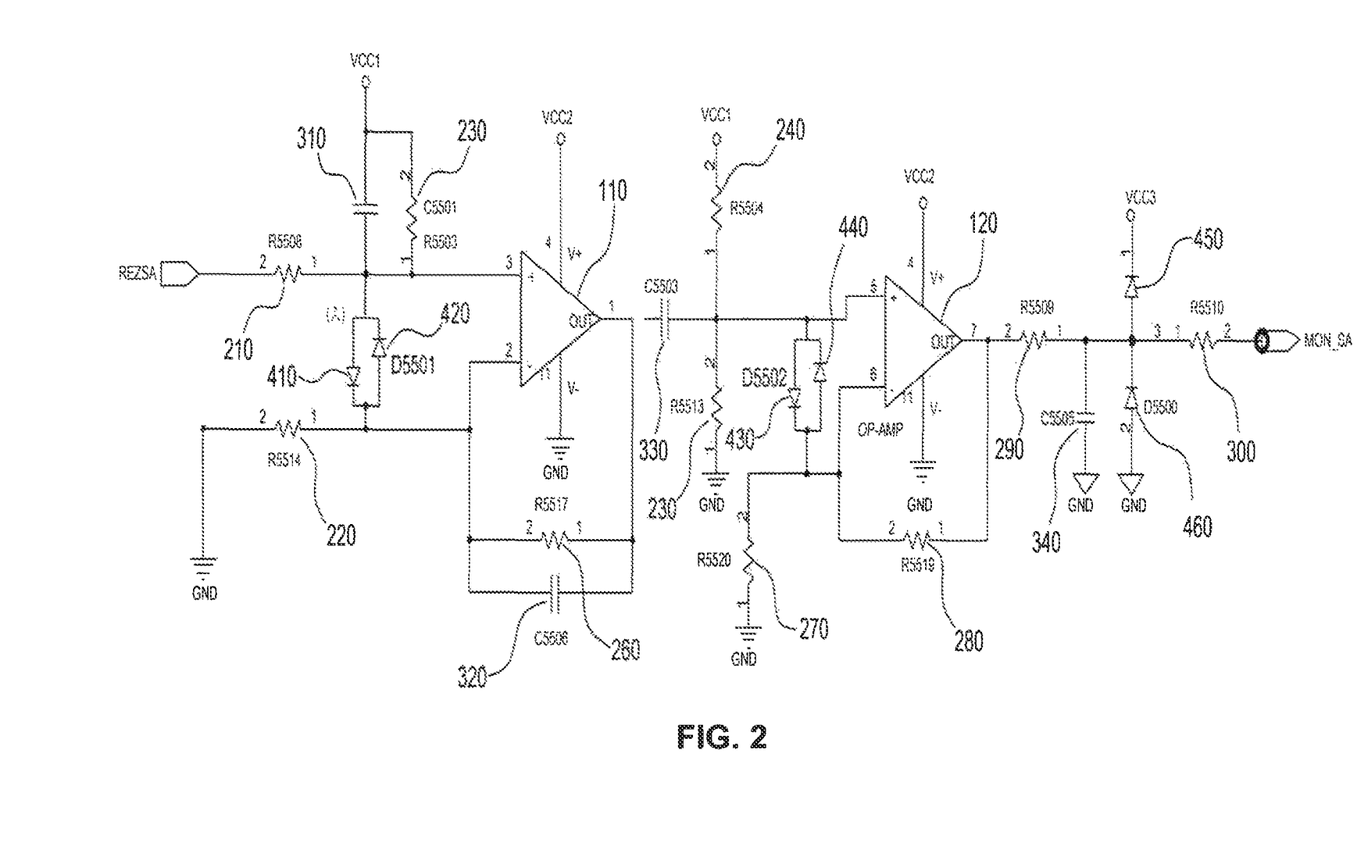
FIG. 2 is a circuit diagram showing an interface circuit for detecting a fault of a resolver according to an exemplary embodiment of the present invention.

FIG. 2 is a circuit diagram showing an interface circuit for detecting a fault in a resolver according to an exemplary embodiment of the present invention. The interface circuit for detecting a fault in the resolver according to the exemplary embodiment of the present invention may include four interface units, for example, which may receive signals from output terminals of the resolver 500, respectively.

The interface circuit for detecting a fault in the resolver may include, for example, the four interface units according to one exemplary embodiment of the present invention. Each of these interface units may include an operational amplifier, a resistor, a capacitor and a diode in order to adjust the sine wave signal and the cosine wave signal as the common mode signal into signals suitable to be recognized by the microcomputer 600.

In FIG. 2, 'REZSA' denotes a terminal of receiving the sine wave signal and the cosine wave signal output from the resolver 500. The output signal of the resolver 500 is applied to the terminal 'REZSA' as the common mode signal. Although the terminal 'REZSA' is briefly depicted as one terminal in the FIG. 2, since the first output terminals controlling the sine wave signal and the second terminals controlling the cosine wave signal are withdrawn from the resolver 500, the terminal 'REZSA' may include a total of four inputs.

The sine wave signal and the cosine wave signal, which are output from the resolver 500 as the common mode signal, may be biased by a first power source VCC1 of the interface circuit, and the gain and offset may be adjusted by the first power source VCC1.

The signal output from the resolver 500 may be input to the non-inverting input terminal of a first operational amplifier 110 through a first resistor 210. In this case, the gain and offset may be adjusted by the first power source VCC1 connected to terminals of a first capacitor 310 and a third resistor 230.

First and second diodes 410 and 420 in the exemplary embodiment of the present invention may be connected in parallel between the non-inverting or inverting input terminals of the first operational amplifier 110, where the connection directions of the first and second diodes 410 and 420 are opposite to each other. The first and second diodes 410 and 420 allow the voltage values applied to the non-inverting or inverting input terminals of the first operational amplifier 110 to be equal to each other. Thus, the voltage difference between the non-inverting and inverting input terminals of the first operational amplifier 110 may be equal to "0" (zero) due to the first and second diodes 410 and 420, as the preferable amplifier.

A first terminal of the second resistor 220 may be connected to the node to which the inverting input terminal of the first operational amplifier 110 and the first and second diodes 410 and 420 are connected. A second terminal of the second resistor 220 may be grounded.

The first operational amplifier 110 suitably amplifies the sine and cosine wave signals as the common mode signal input to the non-inverting and inverting input terminals through the sixth resistor 260 and the second capacitor 320 connected in parallel to the sixth resistor 260, and may output the amplified signals to the output terminal of the first operational amplifier 110.

The second power source VCC2 in the illustrative embodiment of the present invention is applied to the first and second operational amplifiers 110 and 120 as driving power sources.

Notably, in the exemplary embodiment of the present invention, the first operational amplifier 110 may scale down the waveform of the signal withdrawn from the resolver as the common mode signal. Then, the first operational amplifier 110 may apply an offset voltage of about 2.5V to the scale-down signal and may output the resulting signal to the second operational amplifier 120.

The third capacitor 330 may be placed between the output terminal of the first operational amplifier 110 and the non-inverting input terminal of the second operational amplifier 120. This third capacitor 330 may serve as a high-pass filter. Thus, a low frequency signal is removed from the signal output from the output terminal of the first operational amplifier 110, so that a swing signal similar to a sine signal or a cosine signal may be applied to the second operational amplifier 120. That is, the third capacitor 300 may configured to remove the DC offset.

The sine wave signal or cosine wave signal may be biased by the fourth resistor 240 which has a first terminal connected to the non-inverting input terminal of the second operational amplifier 120 and a second terminal connected to the first power source, and the fifth resistor 250 which has a first terminal connected to the non-inverting input terminal of the second operational amplifier 120 and a second terminal connected to the ground, and may be input to the non-inverting input terminal of the second operational amplifier 120 accordingly.

Similarly to the first operational amplifier 110, the third and fourth diodes 430 and 440 may be connected in parallel between the non-inverting and inverting input terminals of the second operational amplifier 120. Due to the third and fourth diodes 430 and 440 of which the opposite polarities are connected to each other, the second operational amplifier 120 may have the voltages of the non-inverting and inverting input terminals, respectively, equal to each other in a preferable amplifier configuration.

Also in the exemplary embodiment of the present invention, a first terminal of the seventh resistor is connected to the non-inverting input terminal of the second operational amplifier 120 and a second terminal of the seventh resistor is connected to the inverting input terminal of the second operational amplifier 120. The eighth resistor 280 may be placed between the non-inverting and inverting input terminals of the second operational amplifier 120.

The second operational amplifier 120 may adjust the offset and gain based on the signals input to the non-inverting and inverting input terminals thereof to generate the signal suitable to be used by the microcomputer 600, and may output the generated signal through the output terminal thereof. As such, the sine wave signal and cosine wave signal output through the output terminal of the second operational amplifier 120 may be applied to a circuit for protecting an input side of the microcomputer 600 through the ninth resistor 290.

In order to protect the input side of the microcomputer 600, the cathode of the fifth diode 450 may be connected to the third power source VCC3 and the anode of the fifth diode 450 may be connected to the cathode of the sixth diode 460. The connection node of the fifth and sixth diodes 450 and 460 may be connected to a first terminal of the ninth resistor 290 and a first terminal of the fourth capacitor 340.

When taking into consideration the signal power source of the microcomputer 600, the third power source, which is a voltage for protecting the input side of the microcomputer 600, may have a voltage of about 5V.

The anode of the sixth diode 460 and the second terminal of the fourth capacitor 340 may be connected to the ground, and the ground may be the reference ground of the third power.

Lastly, the sine wave signal and the cosine wave signal withdrawn as the common mode signal, which is provided to the analog/digital terminal of the microcomputer 600 through the tenth resistor 300, may has a voltage swing in the range of about 0 V to 5 V.

The interface circuit for detecting a fault in a resolver according to the exemplary embodiment of the present invention advantageously adjusts the gain and offset to allow the sine cosine wave signals output from the resolver 500 to be a common mode signal and have a voltage in the range of about 0 V to 5 V, so that a logic, which is capable of detecting a fault in a resolver and has a simple circuit configuration, may be implemented as such.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. A circuit for detecting a fault in a resolver, the circuit comprising:
    a resolver connected to an intermediate point of a stator coil of a first output terminal for a sine wave signal and an intermediate point of the stator coil of a second output terminal for a cosine wave signal, the resolver outputting the sine and cosine wave signals as a common mode signal; and
    a resolver fault detection interface unit configured to adjust a gain and an offset of the sine wave signal and the cosine wave signal in order to adjust the sine wave signal and the cosine wave signal received as the common mode signal at a frequency capable of being applied to an analog/digital terminal of a microcomputer, and to allow high-frequency components of the sine wave signal and the cosine wave signal to pass therethrough,
    wherein the resolver fault detection interface unit includes:
        a first resistor having a first terminal connected to an output terminal of the resolver and a second terminal connected to a first terminal of a first capacitor, a first terminal of a third resistor, a non-inverting input terminal of a first operational amplifier, an anode of a first diode and a cathode of a second diode;
        a second resistor having a first terminal connected to a cathode of the first diode, an anode of the second diode, an inverting input terminal of the first operational amplifier, a first terminal of a sixth resistor and a terminal of a second capacitor;
            wherein an output terminal of the first operational amplifier is connected to a first terminal of a third capacitor, a second terminal of the sixth resistor and a second terminal of the second capacitor,
            a second terminal of the third capacitor is connected to a first terminal of a fourth resistor, a non-inverting input terminal of a second operational amplifier, an anode of the third diode, a cathode of a fourth diode and a first terminal of a fifth resistor,
            a first terminal of a seventh resistor is connected to a cathode of the third diode, an anode of the fourth diode, a non-inverting input terminal of the second operational amplifier and a first terminal of a eighth resistor,
            an output terminal of the second operational amplifier is connected to a first terminal of a ninth resistor and a second terminal of the eighth resistor,
            a second terminal of the ninth resistor is connected to a first terminal of a fourth capacitor, an anode of the fifth diode, a cathode of a sixth diode, and a first terminal of a tenth resistor, and
            a second terminal of the tenth resistor is connected to an analog/digital converting terminal of an operational unit;
        a ground connected to a second terminal of the second resistor, a negative driving power terminal of the first operational amplifier, a second terminal if the fifth resistor, a second terminal of the seventh resistor, a negative driving power terminal of the second operational amplifier, a second terminal of the fourth resistor, and an anode of the sixth diode;
        a first power source connected to a second terminal of the first capacitor, a second terminal of the third resistor, a second terminal of the fourth resistor, and a cathode of the fifth diode; and
        a second power source connected to a positive driving power terminal of the first operational amplifier and a positive driving power terminal of the second operational amplifier.

2. The circuit of claim 1, wherein the resolver fault detection interface unit is made up of a plurality of resolver fault detection interface units that are each individually connected in parallel to output terminals of the resolver, and the resolver fault detection interface units are provided in equal number to that of the output terminals of the resolver, respectively.

3. A method of providing an interface for detecting a fault in a resolver, the method comprising:
    withdrawing, by an interface circuit, a sine signal and a cosine signal as a common mode signal from an output terminal of the resolver that detects a position of a rotor of a motor;
    adjusting, by the interface circuit, a gain of the sine and cosine signals withdrawn as the common mode signal to be suitably applied to an analog/digital converting terminal of a microcomputer;
    adjusting, by the interface circuit, an offset of the sine and cosine signals withdrawn as the common mode signal to be suitably applied to the analog/digital converting terminal of a microcomputer; and applying, by the interface circuit, a signal of the sine and cosine signals withdrawn as the common mode signal to the analog/digital converting terminal of a microcomputer, wherein the interface circuit includes:
  a first resistor having a first terminal connected to an output terminal of the resolver and a second terminal connected to a first terminal of a first capacitor, a first terminal of a third resistor, a non-inverting input terminal of a first operational amplifier, an anode of a first diode and a cathode of a second diode;
  a second resistor having a first terminal connected to a cathode of the first diode, an anode of the second diode, an inverting input terminal of the first operational amplifier, a first terminal of a sixth resistor and a terminal of a second capacitor;
    wherein an output terminal of the first operational amplifier is connected to a first terminal of a third capacitor, a second terminal of the sixth resistor and a second terminal of the second capacitor,
    a second terminal of the third capacitor is connected to a first terminal of a fourth resistor, a non-inverting input terminal of a second operational amplifier, an anode of a third diode, a cathode of a fourth diode and a first terminal of a fifth resistor,
    a first terminal of a seventh resistor is connected to a cathode of the third diode, an anode of the fourth diode, a non-inverting input terminal of the second operational amplifier and a first terminal of a eighth resistor,
    an output terminal of the second operational amplifier is connected to a first terminal of a ninth resistor and a second terminal of the eighth resistor,
    a second terminal of the ninth resistor is connect fourth capacitor, an anode of a fifth diode, a cathode of a sixth diode, and a first terminal of a tenth resistor, and
    a second terminal of the tenth resistor is connected to an analog/digital converting terminal of an operational unit;
  a ground connected to a second terminal of the second resistor, a negative driving power terminal of the first operational amplifier, a second terminal of the fifth resistor, a second terminal of the seventh resistor, a negative driving power terminal of the second operational amplifier, a second terminal of the fourth resistor, and an anode of the sixth diode;
  a first power source connected to a second terminal of the first capacitor, a second terminal of the third resistor, a second terminal of the fourth resistor, and a cathode of the fifth diode; and
  a second power source connected to a positive driving power terminal of the second operational amplifier.

4. The method of claim 3, wherein the withdrawing of the sine signal and the cosine signal as the common mode signal is performed when an intermediate point of a coil between first and third output terminals of the resolver is connected to an intermediate point of a coil between second and fourth terminals of the resolver.

5. A circuit for detecting a fault in a resolver in an electric motor of a hybrid or electric vehicle, the circuit comprising:
  a resolver connected to a stator of the motor to detect fault in the motor, the resolver outputting sine and cosine wave signals as a common mode signal; and
  a resolver fault detection interface unit configured to adjust a gain and an offset of a sine wave signal and a cosine wave signal in order to adjust the sine wave signal and the cosine wave signal received as the common mode signal at a frequency capable of being applied to an analog/digital terminal of a microcomputer, and to allow high-frequency components of the sine wave signal and the cosine wave signal to pass therethrough, wherein the resolver fault detection interface unit is made up of a plurality of resolver fault detection interface units that are each individually connected in parallel to output terminals of the resolver, and the resolver fault detection interface units are provided in equal number to that of the output terminals of the resolver, respectively, wherein the resolver fault detection interface unit includes:
  a first resistor having a first terminal connected to an output terminal of the resolver and a second terminal connected to a first terminal of a first capacitor, a first terminal of a third resistor, a non-inverting input terminal of a first operational amplifier, an anode of a first diode and a cathode of a second diode; and
  a second resistor having a first terminal connected to a cathode of the first diode, an anode of the second diode, an inverting input terminal of the first operation amplifier, a first terminal of a sixth resistor and a terminal of a second capacitor, wherein an output terminal of the first operational amplifier is connected to a first terminal of a third capacitor, a second terminal of the sixth resistor and a second terminal of the second capacitor, a second terminal of the third capacitor is connected to a first terminal of a fourth resistor, a non-inverting input terminal of a second operational amplifier, an anode of a third diode, a cathode of a fourth diode and a first terminal of a fifth resistor, a first terminal of a seventh resistor is connected to a cathode of the third diode, an anode of the fourth diode, a non-inverting input terminal of the second operational amplifier and a first terminal of a eighth resistor, an output terminal of the second operational amplifier is connected to a first terminal of a ninth resistor and a second terminal of the eighth resistor, a second terminal of the ninth resistor is connected to a first terminal of a fourth capacitor, an anode of a fifth diode, a cathode of a sixth diode, and a first terminal of a tenth resistor, and a second terminal of the tenth resistor is connected to an analog/digital converting terminal of an operational unit, and wherein the circuit further comprises:
  a ground connected to a second terminal of the second resistor, a negative driving power terminal of the first operational amplifier, a second terminal of the fifth resistor, a second terminal of the seventh resistor, a negative driving power terminal of the second operational amplifier, a second terminal of the fourth resistor, and an anode of the sixth diode;
  a first power source connected to a second terminal of the first capacitor, a second terminal of the third resistor, a second terminal of a fourth resistor, and a cathode of the fifth diode; and
  a second power source connected to a positive driving power terminal of the first operational amplifier and a positive driving power terminal of the second operational amplifier.

* * * * *